(12) United States Patent
Matsumoto et al.

(10) Patent No.: US 12,424,460 B2
(45) Date of Patent: Sep. 23, 2025

(54) SUBSTRATE PROCESSING APPARATUS

(71) Applicant: Kioxia Corporation, Tokyo (JP)

(72) Inventors: Shusaku Matsumoto, Saitama Saitama (JP); Koichiro Kawano, Kamakura Kanagawa (JP); Shiguma Kato, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 365 days.

(21) Appl. No.: 17/929,923

(22) Filed: Sep. 6, 2022

(65) Prior Publication Data

US 2023/0298910 A1 Sep. 21, 2023

(30) Foreign Application Priority Data

Mar. 16, 2022 (JP) .................................. 2022-041243
Aug. 12, 2022 (JP) .................................. 2022-128898

(51) Int. Cl.
  *H01L 21/67* (2006.01)
  *H01L 21/687* (2006.01)

(52) U.S. Cl.
  CPC .. *H01L 21/67086* (2013.01); *H01L 21/68771* (2013.01)

(58) Field of Classification Search
  None
  See application file for complete search history.

(56) References Cited

U.S. PATENT DOCUMENTS

| | | | |
|---|---|---|---|
| 4,980,017 A * | 12/1990 | Kaji | H01L 21/67075 216/99 |
| 5,482,068 A | 1/1996 | Kitahara et al. | |
| 6,539,963 B1 * | 4/2003 | Dunn | H01L 21/67057 134/182 |
| 7,160,416 B2 * | 1/2007 | Hasegawa | B08B 3/10 156/345.23 |
| 10,840,081 B2 | 11/2020 | Honda et al. | |
| 11,742,226 B2 * | 8/2023 | Otsu | H01L 21/6715 137/561 A |

(Continued)

FOREIGN PATENT DOCUMENTS

| | | |
|---|---|---|
| JP | H8-78381 A | 3/1996 |
| JP | 2012064646 A * | 3/2012 |

(Continued)

*Primary Examiner* — Sylvia MacArthur
(74) *Attorney, Agent, or Firm* — Finnegan, Henderson, Farabow, Garrett & Dunner, LLP

(57) ABSTRACT

A substrate processing apparatus of an embodiment includes: a processing tank that stores a processing solution and houses a plurality of substrates that are to be processed with the processing solution, with the substrates being arranged in a predetermined direction; an inner wall provided in the processing tank to cover at least a partial portion of a substrate surface located at one end in terms of the arrangement direction of the substrates and at least partial portions of side surfaces, of the substrates, that line up along the arrangement direction, with a space where the processing solution flows being present between the inner wall and a bottom surface of the processing tank; and a processing solution nozzle provided at a position that is in the processing tank and outside the inner wall and opening in a manner to cause an upward flow to be formed inside the inner wall.

21 Claims, 8 Drawing Sheets

(56) References Cited

U.S. PATENT DOCUMENTS

| | | | |
|---|---|---|---|
| 2002/0001967 A1* | 1/2002 | Yokomizo | H01L 21/67086 438/745 |
| 2011/0290279 A1* | 12/2011 | Hyakutake | H01L 21/67109 134/105 |
| 2016/0284571 A1* | 9/2016 | Kurashina | H01L 21/67057 |
| 2020/0027758 A1 | 1/2020 | Kurashina et al. | |
| 2020/0027759 A1 | 1/2020 | Kurashina et al. | |
| 2020/0194280 A1 | 6/2020 | Konishi et al. | |
| 2020/0227290 A1 | 7/2020 | Kimura et al. | |
| 2021/0082728 A1* | 3/2021 | Kinoshita | H01L 21/67057 |
| 2023/0298910 A1* | 9/2023 | Matsumoto | H01L 21/67086 156/345.18 |
| 2024/0312803 A1* | 9/2024 | Matsumoto | H01L 21/68764 |

FOREIGN PATENT DOCUMENTS

| | | |
|---|---|---|
| JP | 2019-165067 A | 9/2019 |
| JP | 2020-198352 A | 12/2020 |
| TW | 201705340 A | 2/2017 |
| TW | 202040667 A | 11/2020 |

\* cited by examiner

SUBSTRATE PROCESSING APPARATUS

CROSS REFERENCE TO RELATED APPLICATION

This application is based upon and claims the benefit of priority from Japanese Patent Application No. 2022-041243, filed on Mar. 16, 2022 and Japanese Patent Application No. 2022-128898, filed on Aug. 12, 2022; the entire contents of which are incorporated herein by reference.

FIELD

Embodiments described herein relate generally to a substrate processing apparatus.

BACKGROUND

In a semiconductor device manufacturing process, a process of etching various kinds of films formed on a semiconductor substrate is executed. For example, in a three-dimensional stacked nonvolatile memory device including three-dimensionally stacked memory cells, when a stack of insulating films and conductive films is formed around memory holes, a stack composed of alternately stacked silicon oxide films and silicon nitride films is subjected to a process of selectively etching the silicon nitride films. For the etching, used is, for example, a substrate processing apparatus that executes the etching by immersing a plurality of semiconductor substrates in a processing tank containing an etching solution. Such a substrate processing apparatus is desired to circulate the flow of a processing solution such as the etching solution uniformly to the whole semiconductor substrates placed in the processing tank to uniformly process the semiconductor substrates with the processing solution.

DETAILED DESCRIPTION

A substrate processing apparatus of an embodiment includes: a processing tank that stores a processing solution and houses a plurality of substrates that are to be processed with the processing solution, with the substrates being arranged in a predetermined arrangement direction and having substrate surfaces oriented in a substantially horizontal direction; an inner wall provided in the processing tank to cover at least a partial portion of a substrate surface of the substrate surfaces located at one end in terms of the arrangement direction of the substrates and at least partial portions of side surfaces, of the substrates, that line up along the arrangement direction of the substrates, with a space where the processing solution flows being present between the inner wall and a bottom surface of the processing tank; and a processing solution nozzle provided at a position that is in the processing tank and outside the inner wall, and opening in a manner as to cause an upward flow of the processing solution to be formed inside the inner wall.

Substrate processing apparatuses of embodiments will be hereinafter described with reference to the drawings. In the embodiments, substantially the same constituent parts are denoted by the same reference signs and a description thereof may be partly omitted. The drawings are schematic and the relation of thickness and planar dimension, a thickness ratio among parts, and so on may be different from actual ones.

Figure 1:
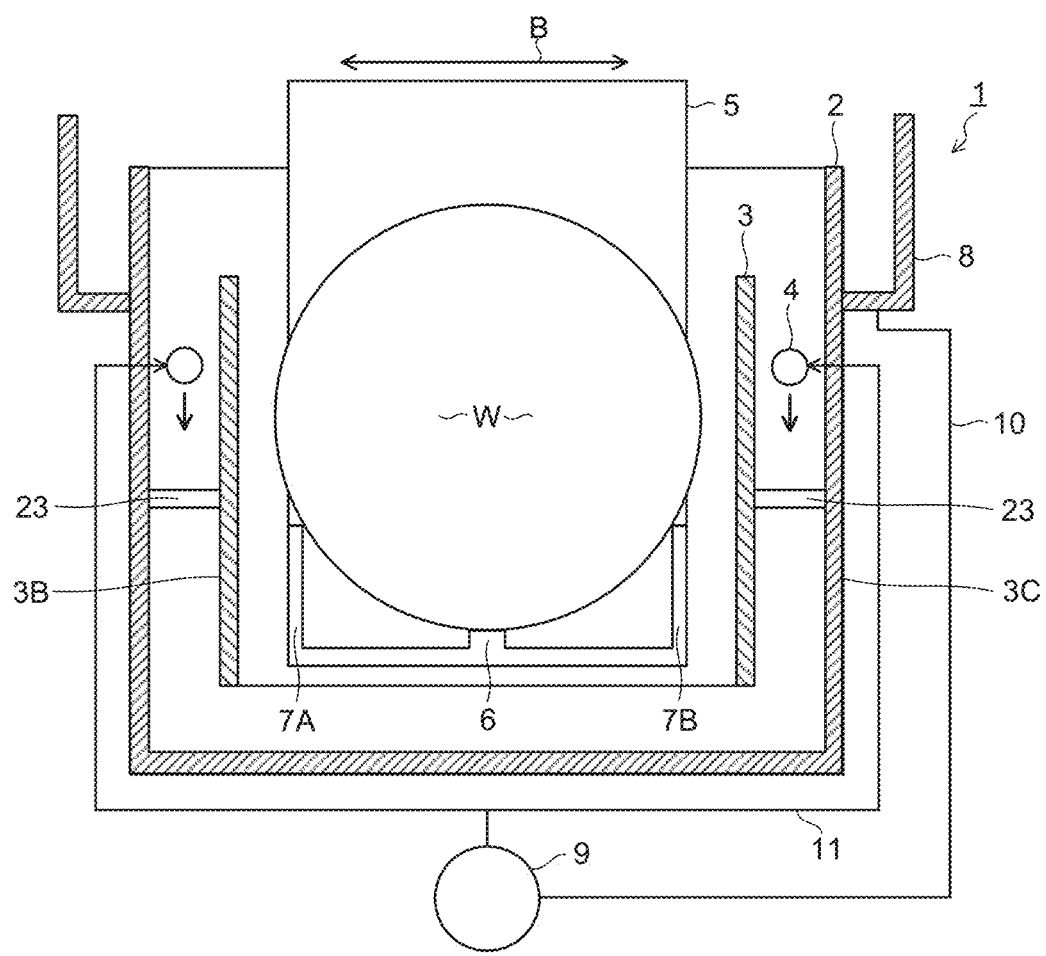
FIG. 1 is a front view illustrating a substrate processing apparatus of an embodiment, partly in section.
Figure 2:
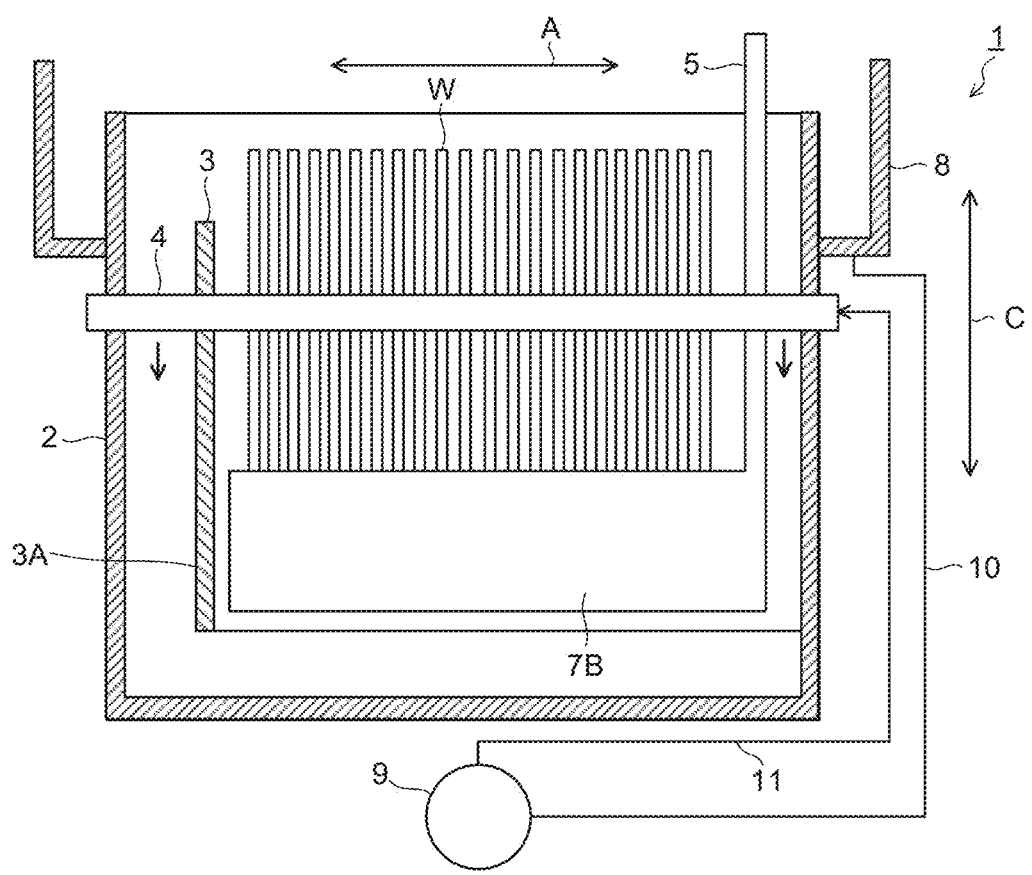
FIG. 2 is a side view of the substrate processing apparatus illustrated in FIG. 1, partly in section.

FIG. 1 is a front view illustrating a substrate processing apparatus of an embodiment, partly in section, and FIG. 2 is a side view illustrating the substrate processing apparatus illustrated in FIG. 1, partly in section. The substrate processing apparatus 1 illustrated in FIG. 1 and FIG. 2 is a batch-type processing apparatus that processes a plurality of substrates W at a time with a processing solution and includes: a processing tank 2 that stores the processing solution; an inner wall 3 provided in the processing tank 2; and processing solution nozzles 4 provided at positions that are in the processing tank 2 and outside the inner wall 3.

The processing tank 2 not only stores the processing solution but also houses the plurality of substrates W that are to be processed with the processing solution, with the substrates W being arranged in a predetermined direction and having their substrate surfaces (surfaces to be processed where to form devices or opposite surfaces of the substrates W) oriented in a substantially horizontal direction. The processing solution is selected according to the processing of the substrates W. In the case where semiconductor substrates used as the substrates W are to be etched, an etching solution is used. As the etching solution, any of the various known etching solutions is stored in the processing tank 2. For example, in the case where silicon nitride films present on the semiconductor substrates are to be etched, a phosphoric acid aqueous solution heated to around 150° C. is used.

As the phosphoric acid aqueous solution, which is the etching solution of the silicon nitride films, a typical aqueous solution of inorganic phosphoric acid (orthophosphoric acid) represented by $H_3PO_4$ is used. $H_4P_2O_7$ (pyrophosphoric acid) or the like may be used instead of or in addition to H₃PO₄. An additive or the like may be contained in the phosphoric acid aqueous solution to increase the etching rate of the silicon nitride films. For example, phosphate such as alkali metal salt of phosphoric acid, organic phosphoric acid, or the like may be added. The description here is mainly about the case where the substrate processing apparatus 1 is a wet etching apparatus, but the substrate processing apparatus 1 is not limited to this and may be a substrate cleaning apparatus or the like.

The substrates W are supported by a lifter 5 in a substantially vertically propped posture while arranged in the predetermined direction (first direction A), and in this state, are housed in the processing tank 2 and are subjected to predetermined processing such as the etching with the processing solution stored in the processing tank 2. By a not-illustrated lift unit, the lifter 5 is movable up and down between a processing position (processing region) where the substrates W are immersed in the processing solution stored in the processing tank 2 and a standby position above the processing tank 2. When the lifter 5 is down at the processing position while supporting the substrates W, the substrates W are immersed in the processing solution and subjected to predetermined processing such as the etching. The lifter 5 has a middle support member 6 that supports lower edge middle portions of the substrates W to be capable of supporting the substrates W at predetermined intervals; and a pair of side support members 7A, 7B that support side portions of the substrates W.

The processing tank 2 includes a circulating system for circulating the processing solution. The circulating system includes an overflow part 8, a circulating pump 9, the processing solution nozzles 4 that jet the processing solution, a first pipe 10 connecting the overflow part 8 and the circulating pump 9, and a second pipe 11 connecting the circulating pump 9 and the processing solution nozzles 4. The processing tank 2 may be provided with a processing solution supply part that supplies the processing solution and as required, may be provided with, for example, a processing solution temperature adjusting part that adjusts the temperature of the processing solution, though they are not illustrated. The circulating system may include a filter for removing a solid reaction product and so on in the processing solution. The overflow part 8 is on an upper edge portion of the processing tank 2 to recover the processing solution flowing over the upper edge of the processing tank 2 during the circulation of the processing solution. The processing solution recovered by the overflow part 8 is sent to the circulating pump 9 through the first pipe 10. The processing solution jetted from the circulating pump 9 is sent to the processing solution nozzles 4 through the second pipe 10. The processing solution is jetted from the processing solution nozzles 4.

In the processing tank 2, an inner wall 3 is provided to separate the processing region of the substrates W supported by the lifter 5 from an outer region, in the processing tank 2, where the processing solution nozzles 4 are disposed. The inner wall 3 covers at least a heightwise partial portion of the substrate surface located at one end in terms of the arrangement direction of the substrates W (first direction A) and at least heightwise partial portions of side surfaces, of the substrates W, lining up in the arrangement direction. That is, the inner wall 3 is provided such that a space (lower flow space) where the processing solution is allowed to flow is present between the bottom surface of the processing tank 2 and the inner wall 3. The inner wall 3 does not have a bottom surface under the array of the substrates W. The inner wall 3 is arranged such that a flow space of the processing solution (upper flow space) is present above the inner wall 3.

The inner wall 3 has a shape surrounding three sides of the processing region of the substrates W, with its one surface at the other end in terms of the arrangement direction of the substrates W being joined to an inner wall surface of the processing tank 2. Specifically, the inner wall 3 has a first surface 3A, a second surface 3B, and a third surface 3C that surround the three sides of the processing region of the substrates W. The first surface 3A covers at least a heightwise partial portion of the substrate surface located at the one end in terms of the arrangement direction of the substrates W (first direction A). One end of the second surface 3B is joined to one end of the first surface 3A in terms of a direction (second direction B) intersecting with the first direction A. One end of the third surface 3C is joined to the other end of the first surface 3A in terms of the second direction B. The other end of the second surface 3B and the other end of the third surface 3C are joined to the inner wall surface of the processing tank 2. Further, between the second and third surfaces 3B, 3C of the inner wall 3 and the inner wall surfaces of the processing tank 2 facing the second surface 3B and the third surface 3C, supports 23 connecting the inner wall 3 and the processing tank 2 to reinforce the inner wall 3 is provided.

Owing to the inner wall 3 with such a shape installed in the processing tank 2, the processing solution flows between the three surfaces of the inner wall 3 and the three inner wall surfaces of the processing tank 2 in a depth direction of the processing tank 2 (third direction C intersecting with the first direction A), and also flows in the lower flow space present between the bottom surface of the processing tank 2 and the inner wall 3 and in the upper flow space present between the upper portion of the processing tank 2 and the inner wall 3. Further, in the substrate W processing region surrounded by the three surfaces of the inner wall 3 and the other-end side inner wall surface of the processing tank 2 in terms of the arrangement direction of the substrates W or a back plate of the lifter 5, the processing solution also flows in the depth direction (third direction C) of the processing tank 2.

Figure 3:
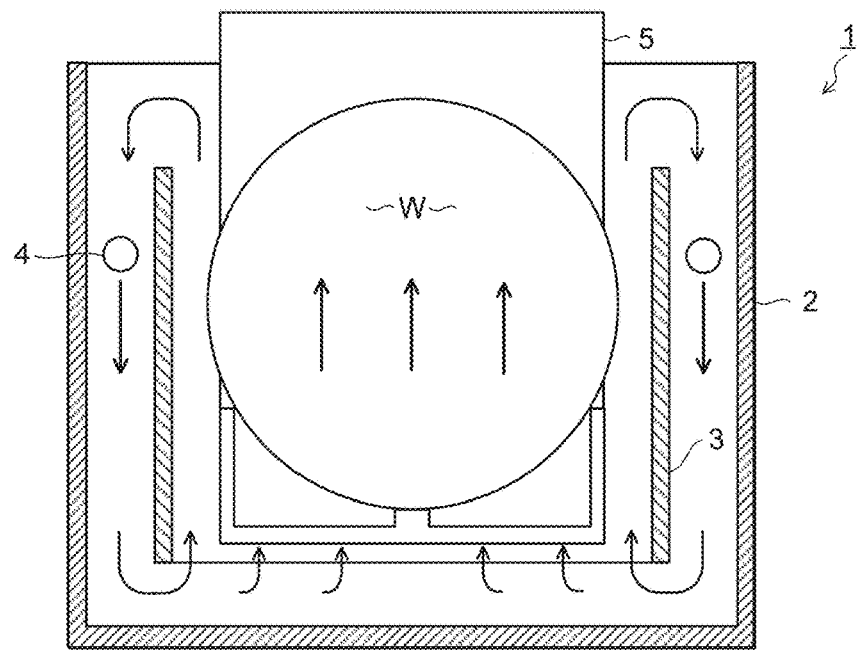
FIG. 3 is a view illustrating flows of a processing solution in the substrate processing apparatus illustrated in FIG. 1.

FIG. 3 illustrates flows of the processing solution in the substrate processing apparatus 1 of the embodiment. As illustrated in FIG. 3, in the processing tank 2 having the inner wall 3 as structured above, the processing solution nozzles 4 are disposed between the inner wall 3 and the inner wall surfaces, of the processing tank 2, which are outside the inner wall 3, and the processing solution nozzles 4 open toward the bottom surface of the processing tank 2. Between the inner wall 3 and the inner wall surfaces of the processing tank 2, downward flows are formed by the processing solution jetted from the processing solution nozzles 4. Then, the processing solution passes in the processing solution flow space present between the bottom surface of the processing tank 2 and the inner wall 3 to flow to the substrate W processing region surrounded by the inner wall 3. In the processing region of the substrates W, upward flows of the processing solution are formed. The height of the inner wall 3 is preferably set such that its upper end is higher than a half height position of the substrates W and is higher than the installation positions of the processing solution nozzles 4. This can prevent the downward flows formed by the processing solution between the inner wall 3 and the inner wall surfaces of the processing tank 2 from interfering with the upward flows formed by the processing solution in the substrate W processing region surrounded by the inner wall 3.

As described above, owing to the inner wall 3 provided in the processing tank 2 and the processing solution nozzles 4 installed between the inner wall 3 and the inner wall surfaces of the processing tank 2 while opening downward, the downward flows of the processing solution are formed between the inner wall 3 and the inner wall surfaces of the processing tank 2 and the upward flows of the processing solution are formed in the processing region of the substrates W. Separating the regions where the downward flows and the upward flows of the processing solution are formed makes it possible to prevent the downward flows and the upward flows of the processing solution from facing each other at the same place and interfering with each other. This results in the constant flow rate of the upward flows of the processing solution in the processing region of the substrates W to achieve the uniform processing of the substrates W. Further, the reaction product such as silica produced by, for example, the etching of the silicon nitride films flows uniformly, making it possible to prevent the staying or the like of the reaction product at, for example, a place where the flow is stagnant. These make it possible to supply the processing solution uniformly to the whole surfaces of the substrates W to uniformly process the substrates W with the processing solution.

Figure 4:
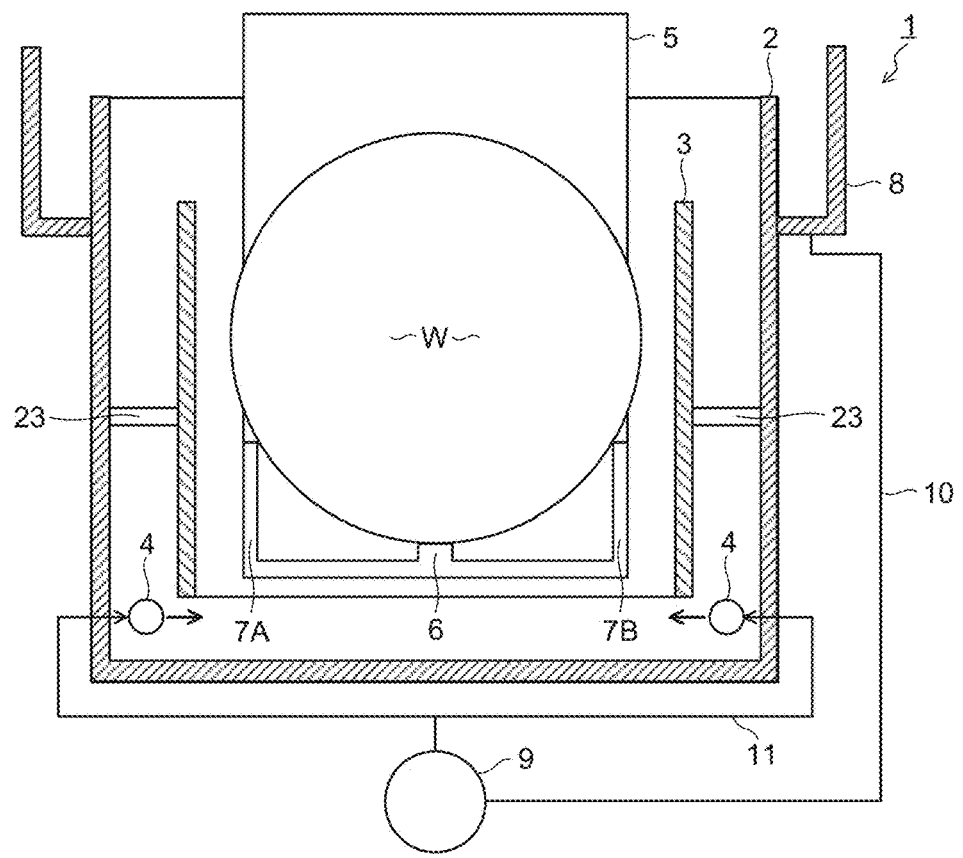
FIG. 4 is a front view of another example of the substrate processing apparatus of the embodiment, partly in section.
Figure 5:
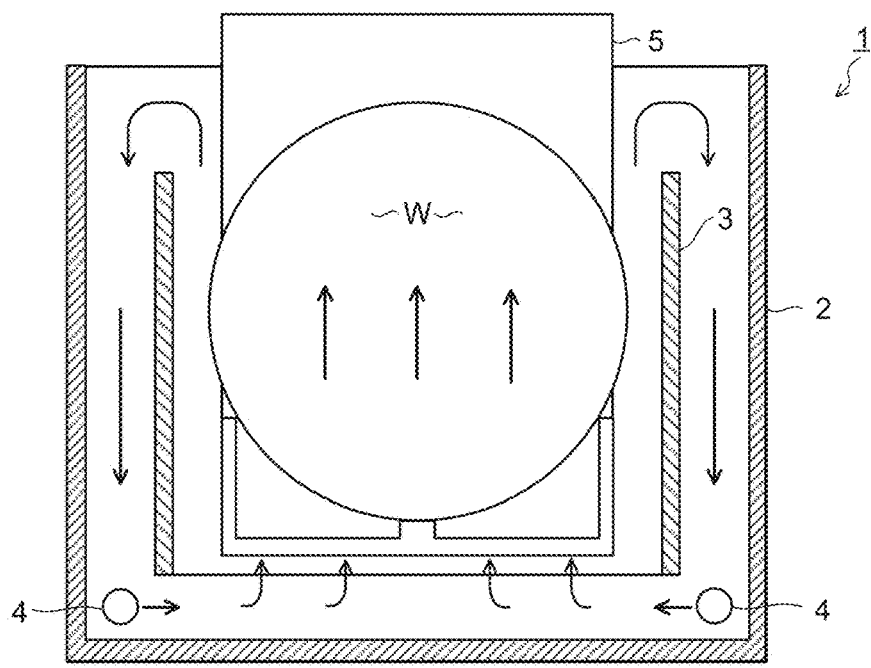
FIG. 5 is a view illustrating flows of the processing solution in the substrate processing apparatus illustrated in FIG. 4.

In FIG. 1, FIG. 2, and FIG. 3, the processing solution nozzles 4 open downward, but the opening direction of the processing solution nozzles 4 is not limited to this. It suffices that the processing solution nozzles 4 open in a manner to cause the formation of the upward flows of the processing solution in the inner region of the inner wall 3, that is, in the processing region of the substrates W and to cause the formation of the downward flows of the processing solution between the inner wall 3 and the inner wall surfaces of the processing tank 2. FIG. 4 is a front view illustrating another substrate processing apparatus of the embodiment, partly in section, and FIG. 5 illustrates flows of the processing solution in the other substrate processing apparatus of the embodiment. For example, as illustrated in FIG. 4, the processing solution nozzles 4 may be installed between the inner wall 3 and the inner wall surfaces of the processing tank 2 while opening toward the lower flow space present between the bottom surface of the processing tank 2 and the inner wall 3. As illustrated in FIG. 5, such processing solution nozzles 4 are also capable of forming upward flows of the processing solution in the substrate W processing region inside the inner wall 3 and forming downward flows of the processing solution between the inner wall 3 and the inner wall surfaces of the processing tank 2. The opening direction of the processing solution nozzles 4 may be any as long as the aforesaid formation of the upward flows of the processing solution in the processing region of the substrates W and the aforesaid formation of the downward flows of the processing solution between the inner wall 3 and the inner wall surfaces of the processing tank 2 are not hindered.

Figure 6:
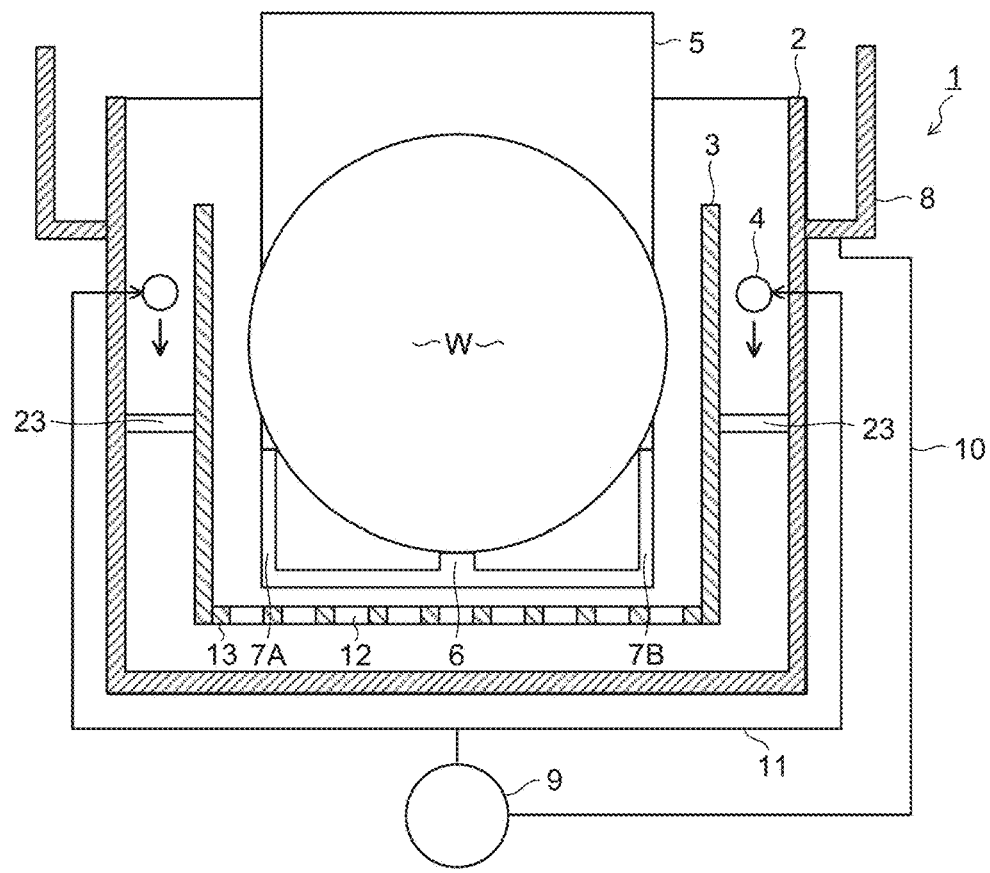
FIG. 6 is a front view illustrating a first modification example of the substrate processing apparatus of the embodiment, partly in section.

The inner wall 3 illustrated in FIG. 1 and FIG. 2 does not have a bottom surface, but the shape of the inner wall 3 is not limited to this. FIG. 6 is a front view illustrating a first modification example of the substrate processing apparatus of the embodiment, partly in section. For example, as illustrated in FIG. 6, the inner wall 3 may have, along its bottom portion, a bottom plate 13 having a plurality of openings 12. In this case, downward flows of the processing solution are formed between the inner wall 3 and the inner wall surfaces of the processing tank 2, and these downward flows flow along the bottom plate 13 to flow to the processing region of the substrates W through the openings 12. The processing solution having flowed to the processing region of the substrates W forms upward flows in the processing region of the substrates W. Therefore, the downward flows and the upward flows of the processing solution are prevented from facing each other at the same place and interfering with each other as in the substrate processing apparatus 1 illustrated in FIG. 1 and FIG. 2. This results in the uniform flow rate of the upward flows of the processing solution in the processing region of the substrates W to achieve the uniform processing of the substrates W. It is also possible to prevent the staying or the like of the reaction product at, for example, a place where the flow is stagnant. Because of these, it is possible to supply the processing solution uniformly to the whole surfaces of the substrates W to uniformly process them with the processing solution.

Figure 7:
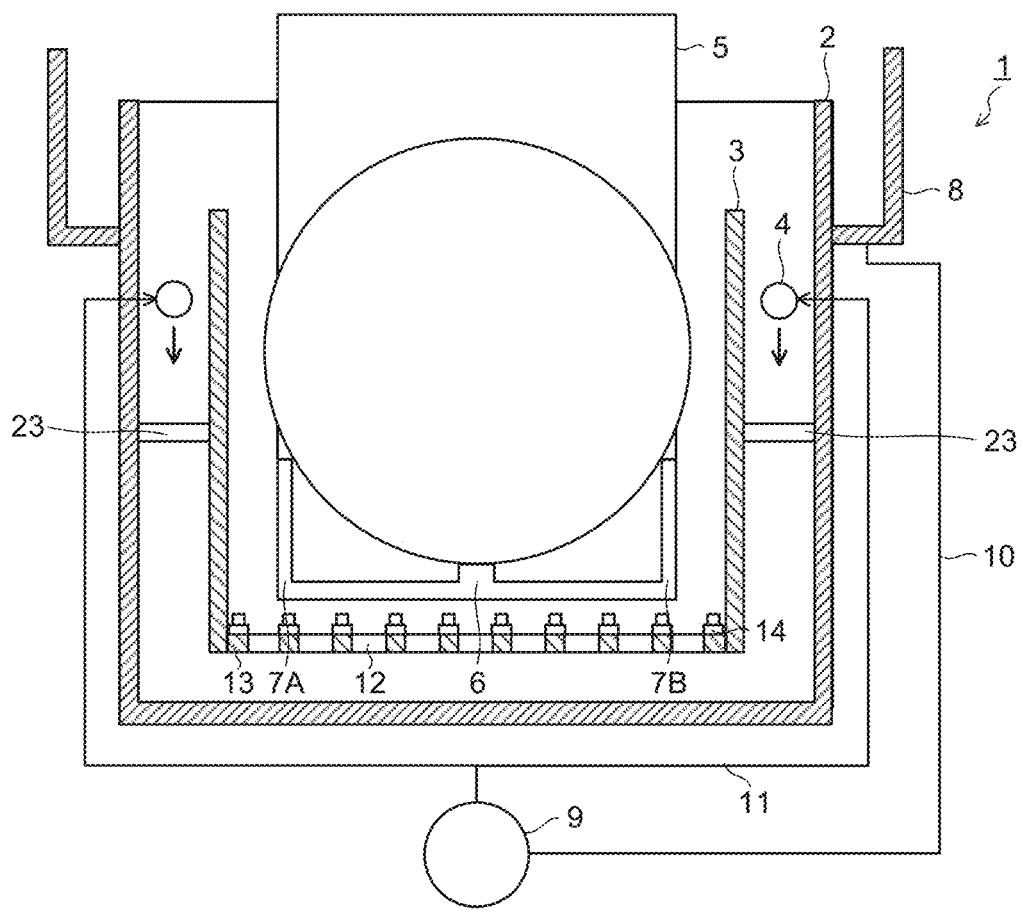
FIG. 7 is a front view illustrating a second modification example of the substrate processing apparatus of the embodiment, partly in section.

In the case where the bottom plate 13 having the openings 12 is provided along the bottom portion of the inner wall 3 as illustrated in FIG. 6, a bubble nozzle (bubbler) 14 is preferably provided on the bottom plate 13. FIG. 7 is a front view illustrating a second modification example of the substrate processing apparatus of the embodiment, partly in section. By providing the bubble nozzle 14 on the bottom plate 13 having the openings 12 as illustrated in, for example, FIG. 7, it is possible to cause the bubbling of the processing solution. The bubble nozzle 14 is connected to a not-illustrated compressed gas supply device such as a compressor. The gas that the bubble nozzle 14 jets may be air, or may be an inert gas such as a nitrogen gas or an argon gas. The bubble nozzle 14 opens toward the substrates W thereabove. This enables the processing solution to bubble in the processing region of the substrates W to promote the formation of the upward flows of the processing solution. As a result of promoting the formation of the upward flows of the processing solution in the processing region of the substrates W, the processing solution is more uniformly and efficiently supplied to the whole surfaces of the substrates W, enabling the uniform and efficient processing of the whole surfaces of the substrates W with the processing solution.

Figure 8:
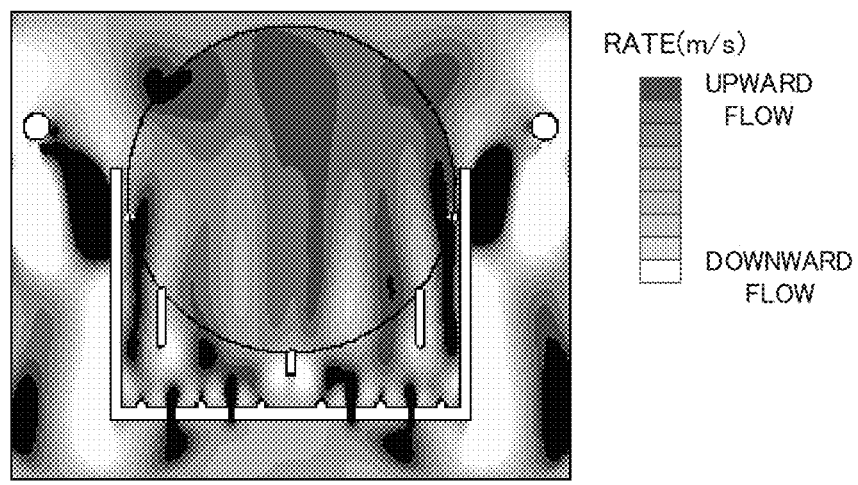
FIG. 8 is a view illustrating the flow rate distribution of the processing solution in the substrate processing apparatus illustrated in FIG. 7.
Figure 9:
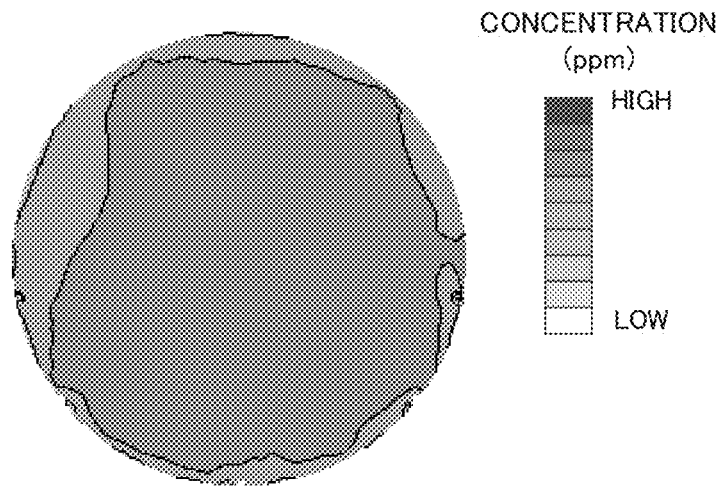
FIG. 9 is a view illustrating the concentration distribution of silica in the substrate processing apparatus illustrated in FIG. 7.

FIG. 8 illustrates the flow rate distribution of the processing solution when the substrate processing apparatus 1 illustrated in FIG. 7 is used. FIG. 9 illustrates the concentration distribution of silica, which is the reaction product, when the substrate processing apparatus 1 illustrated in FIG. 7 is used. For comparison with FIG. 8 and FIG. 9, FIG. 10 and FIG. 11 respectively illustrate the flow rate distribution of the processing solution and the concentration distribution of silica when a comparative substrate processing apparatus is used in which processing solution nozzles and a bubble nozzle are installed under the lifter while opening upward. FIG. 8 to FIG. 11 all illustrate the states when phosphoric acid is used as the processing solution and its bubbling is caused by a nitrogen gas ($N_2$). As is seen from FIG. 8, in the case where the substrate processing apparatus 1 of the embodiment is used, variation in the flow rate of the processing solution is small and a part where the flow rate is high or a part where the flow rate is low does not easily occur locally. Further, as illustrated in FIG. 9, in the case where the substrate processing apparatus 1 of the embodiment is used, variation in the concentration distribution of silica, which is the reaction product, is also small. These show that the substrate processing apparatus 1 of the embodiment achieves the uniform and efficient processing of the whole surfaces of the substrates W with the processing solution.

Figure 10:
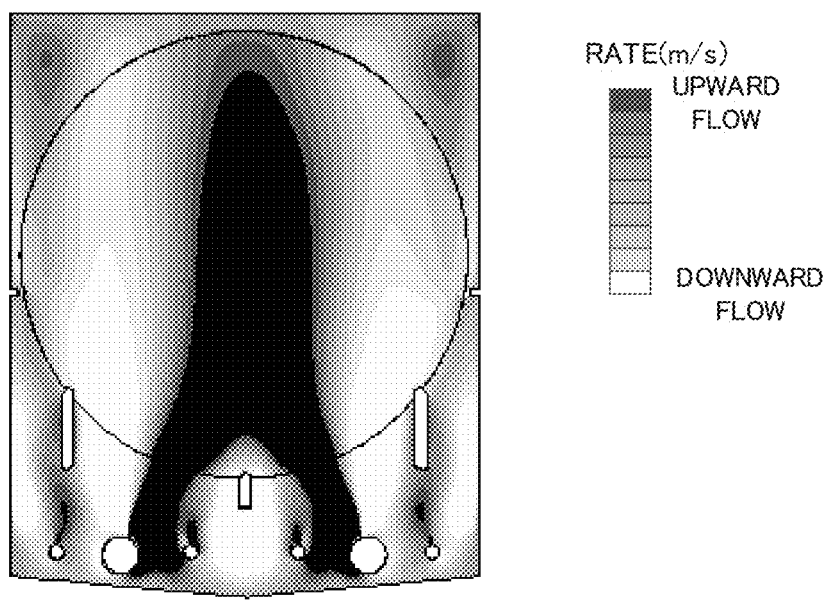
FIG. 10 is a view illustrating the flow rate distribution of the processing solution in a comparative substrate processing apparatus.
Figure 11:
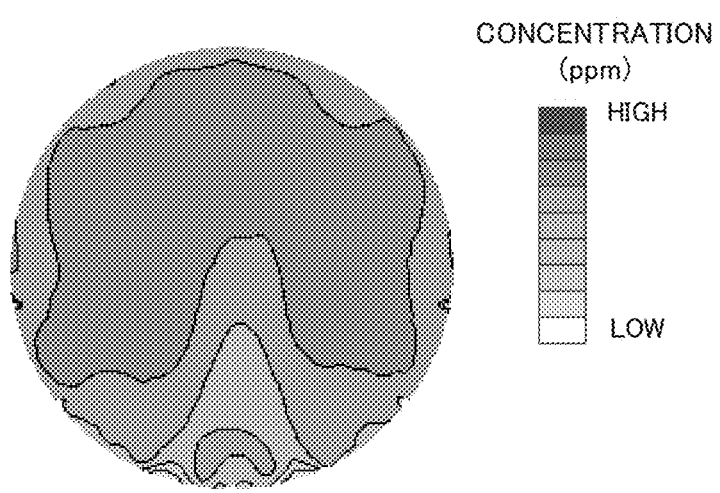
FIG. 11 is a view illustrating the concentration distribution of silica in the comparative substrate processing apparatus.

In the comparative substrate processing apparatus, on the other hand, as illustrated in FIG. 10, a region where the flow rate is high occurs in the center and the flow rate in the periphery thereof is low. This is because if the region where the flow rate is high occurs in the center, downward flows tend to be formed therearound, so that upward flows and the downward flows face each other in the peripheral region. Therefore, the flow rate in the peripheral region tends to become lower. Because of these, in the comparative substrate processing apparatus, the flow rate of the processing solution to the whole surfaces of the substrate W tends to vary. This will be a factor that lowers the uniformity in the processing of the whole surfaces of the substrates W with the processing solution. This is also obvious from the silica concentration distribution illustrated in FIG. 11, in which variation in the concentration distribution of the reaction product is also large because of the large variation in the flow rate. It is seen that the comparative substrate processing apparatus does not achieve the uniform processing of the whole surfaces of the substrates W with the processing solution.

Figure 12:
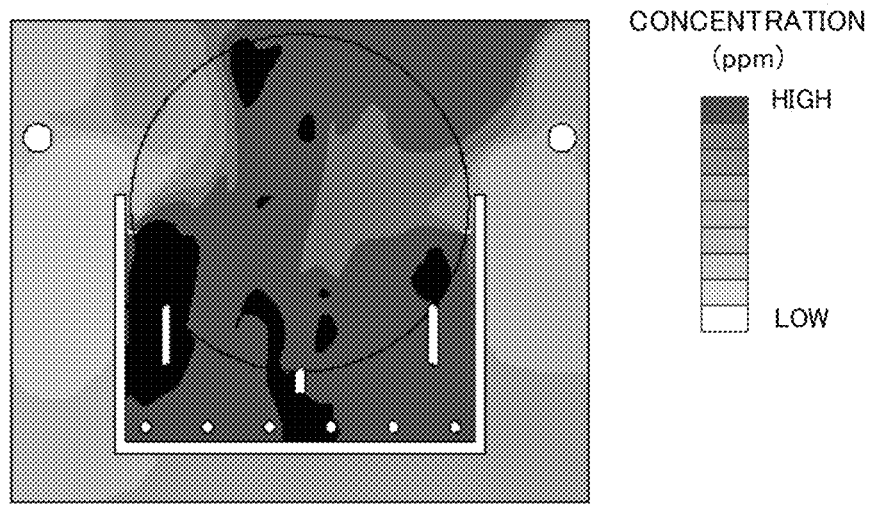
FIG. 12 is a view illustrating the concentration distribution of silica in a comparative substrate processing apparatus.

Further, FIG. 12 illustrates the concentration distribution of silica, which is the reaction product, when a comparative substrate processing apparatus is used that has the same configuration as that of the substrate processing apparatus 1 illustrated in FIG. 7 except that the openings are not formed in the bottom plate 13 provided along the bottom portion of the inner wall 3. As is obvious from FIG. 12, in the case where the bottom plate 13 does not have the openings, variation in the concentration distribution of silica, which is the reaction product, is large and the concentration distribution especially inside the inner wall 3 is high because the processing solution stays inside the inner wall 3 having the bottom plate 13 and the flow of the processing solution is hindered. This also shows that it is effective to form the openings 12 in the bottom plate 13 and also provide the bubble nozzle 14 to promote the formation of the flows (upward flows) of the processing solution inside the inner wall 3.

Figure 13:
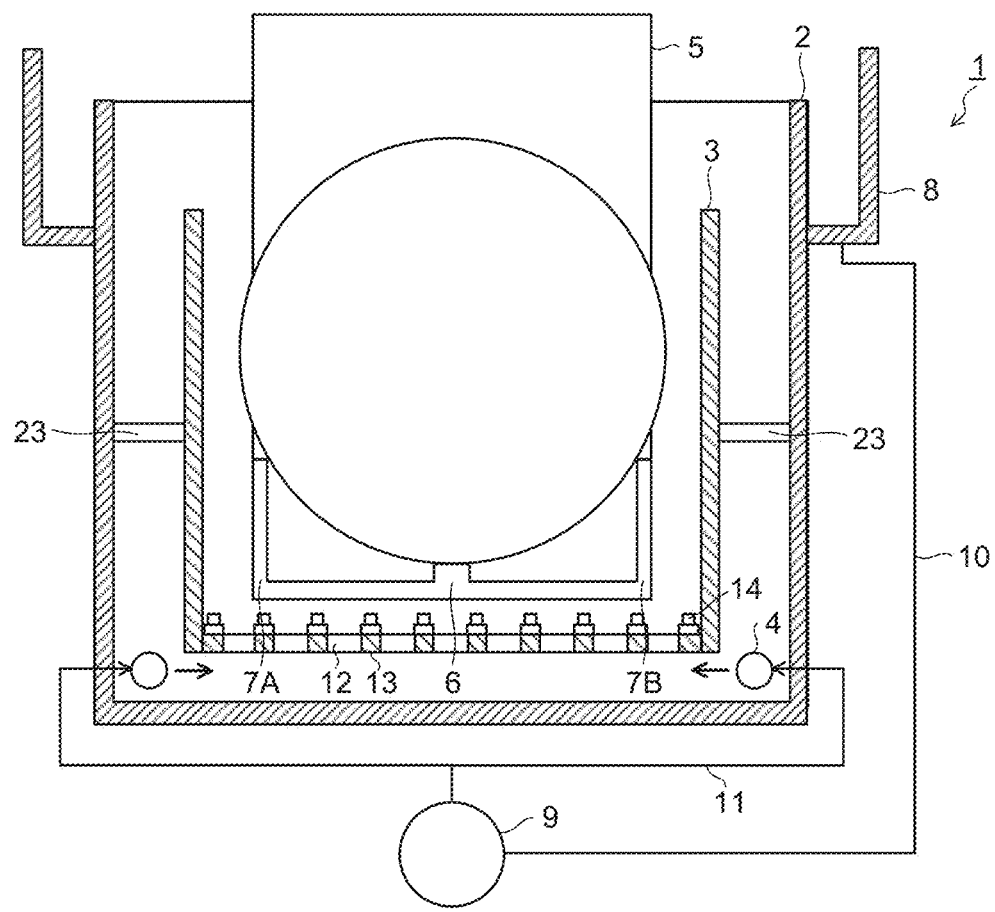
FIG. 13 is a front view illustrating a modification example of the substrate processing apparatus illustrated in FIG. 4, partly in section.

A modification example in which the bubble nozzle 14 is provided on the bottom plate 13 having the openings 12 to cause the bubbling of the processing solution is not limited to the substrate processing apparatus 1 illustrated in FIG. 7. FIG. 13 is a front view illustrating a modification example of the substrate processing apparatus illustrated in FIG. 4, partly in section. For example, the substrate processing apparatus 1 illustrated in FIG. 13 is also effective. This substrate processing apparatus 1 includes a combination of: the processing solution nozzles 4, illustrated in FIG. 4, that open toward the lower flow space; and the bubble nozzle 14, illustrated in FIG. 7, that is installed on the bottom plate 13 provided along the bottom portion of the inner wall 3 and having the openings 12. The substrate processing apparatus 1 illustrated in FIG. 13 includes: the processing solution nozzles 4 installed between the inner wall 3 and the inner wall surfaces of the processing tank 2 and opening toward the lower flow space between the bottom surface of the processing tank 2 and the inner wall 3 so as to cause the formation of upward flows of the processing solution in the processing region of the substrates W; and the bubble nozzle 14 provided on the bottom plate 13 having the openings 12. The basic configuration of the substrate processing apparatus 1 illustrated in FIG. 13 is the same as that of the substrate processing apparatus 1 illustrated in FIG. 7. The substrate processing apparatus 1 illustrated in FIG. 13, similarly to the substrate processing apparatus 1 illustrated in FIG. 7, is capable of promoting the formation of the upward flows of the processing solution by causing the processing solution to bubble. Therefore, the processing solution is more uniformly and efficiently supplied to the whole surfaces of the substrates W, achieving the more uniform and efficient processing of the whole surfaces of the substrates W with the processing solution.

According to the substrate processing apparatuses 1 of the above-described embodiments, by forming mainly the downward flows of the processing solution between the inner wall 3 and the inner wall surfaces of the processing tank 2 and forming mainly the upward flows of the processing solution in the processing region of the substrates W, it is possible to prevent the downward flows and the upward flows of the processing solution from facing each other at the same place and interfering with each other. Further, by providing the bubble nozzle 14 on the bottom plate 13 having the openings 12, it is possible to promote the formation of the upward flows of the processing solution in the processing region of the substrates W. These result in the uniform flow rate of the upward flows of the processing solution in the processing region of the substrates W to achieve the uniform processing of the substrates W. It is also possible to reduce the variation in the processing with the processing solution due to the staying of the reaction product produced by the processing of the substrates W. These result in the uniform supply of the processing solution to the whole surfaces of the substrates W to achieve the uniform processing of the substrates W with the processing solution.

It should be noted that the configurations of the above-described embodiments may be employed in combination and may be also partly replaced. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
    a processing tank that stores a processing solution and houses a plurality of substrates to be processed with the processing solution, the plurality of substrates being arranged in an arrangement direction;
    an inner wall provided in the processing tank, the inner wall comprising:
    a first surface that covers at least a partial portion of a surface of a substrate located at one end of the arrangement direction of the plurality of substrates,
    a second surface that extends along the arrangement direction and covers at least partial portions of side surfaces of the plurality of substrates, and
    a third surface that extends along the arrangement direction and covers at least partial portions of side surfaces of the plurality of substrates, with a space between the inner wall and a bottom surface of the processing tank where the processing solution flows;
    a processing solution nozzle provided at an upper part of the processing tank and outside the inner wall, the processing solution nozzle extending in the arrangement direction and having an opening so that the processing solution discharged toward the bottom surface of the processing tank from the opening; and
    a bottom plate that covers a bottom portion of the inner wall, the bottom plate having an opening that extends in the arrangement direction through which the processing solution passes.

2. The apparatus according to claim 1, wherein the opening of the processing solution nozzle opens toward the space present between the inner wall and the bottom surface of the processing tank.

3. The apparatus according to claim 1, wherein the opening of the processing solution nozzle opens to cause a downward flow to be formed between the inner wall and an inner surface of the processing tank.

4. The apparatus according to claim 1, wherein
one end of the second surface is joined to one end of the first surface in a direction intersecting with the arrangement direction,
one end of the third surface is joined to the other end of the first surface in the direction intersecting with the arrangement direction, and
the other end of the second surface and the other end of the third surface are joined to an inner surface of the processing tank.

5. The apparatus according to claim 1, further comprising a bubble nozzle provided on the bottom plate.

6. The substrate processing apparatus according to claim 5, further comprising a lifter that supports the plurality of substrates, the lifter being provided above the bubble nozzle.

7. The substrate processing apparatus according to claim 5,
wherein the bubble nozzle is provided between the processing solution nozzle and the bottom plate in a direction vertical to the arrangement direction.

8. The apparatus according to claim 1, wherein the inner wall is arranged such that an upper end of the inner wall is higher than a half height position of the plurality of substrates and a flow space of the processing solution is present above the inner wall.

9. The apparatus according to claim 1, further comprising:
an overflow tank that recovers the processing solution overflowing from the processing tank;
a circulating pipe that returns, to the processing tank, the processing solution recovered in the overflow tank; and
a circulating pump provided in the circulating pipe,
wherein the circulating pipe is connected to the processing solution nozzle.

10. The substrate processing apparatus according to claim 1, further comprising a lifter that supports the plurality of substrates in a substantially vertical posture and is movable up and down between a processing position of the plurality of substrates that is in the processing tank and a standby position of the plurality of substrates that is above the processing tank.

11. The substrate processing apparatus according to claim 1, further comprising a support connecting the inner wall and the processing tank,
wherein the processing solution nozzle is provided above the support.

12. The substrate processing apparatus according to claim 1,
wherein the opening of the bottom plate includes a first opening and a second opening adjacent to the first opening in the direction intersecting with the arrangement direction, the first opening extending in the arrangement direction, and the second opening extending in the arrangement direction.

13. The substrate processing apparatus according to claim 12,
wherein the opening of the bottom plate further includes a third opening adjacent to the second opening in the direction intersecting with the arrangement direction, the third opening extending in the arrangement direction.

14. A substrate processing apparatus comprising:
a processing tank that stores a processing solution and houses a plurality of substrates to be processed with the processing solution, the plurality of substrates being arranged in an arrangement direction;
an inner wall provided in the processing tank, the inner wall comprising:
a first surface that covers at least a partial portion of a surface of a substrate located at one end of the arrangement direction of the plurality of substrates,
a second surface that extends along the arrangement direction and covers at least partial portions of side surfaces of the plurality of substrates, and
a third surface that extends along the arrangement direction and covers at least partial portions of side surfaces of the plurality of substrates, with a space between the inner wall and a bottom surface of the processing tank where the processing solution flows;
a processing solution nozzle provided at an upper part of the processing tank and outside the inner wall, the processing solution nozzle extending in the arrangement direction and having an opening that opens toward the bottom surface of the processing tank; and
a bottom plate that covers a bottom portion of the inner wall, the bottom plate having an opening that extends in the arrangement direction through which the processing solution passes.

15. The apparatus according to claim 14, further comprising a bubble nozzle provided on the bottom plate.

16. The substrate processing apparatus according to claim 15, further comprising a lifter that supports the plurality of substrates, the lifter being provided above the bubble nozzle.

17. The apparatus according to claim 14, wherein the opening of the processing solution nozzle opens to cause a downward flow to be formed between the inner wall and an inner surface of the processing tank.

18. The apparatus according to claim 14, wherein the inner wall is arranged such that an upper end of the inner wall is higher than a half height position of the plurality of substrates and a flow space of the processing solution is present above the inner wall.

19. The apparatus according to claim 14, wherein
one end of the second surface is joined to one end of the first surface in a direction intersecting with the arrangement direction,
one end of the third surface is joined to the other end of the first surface in the direction intersecting with the arrangement direction, and
the other end of the second surface and the other end of the third surface are joined to an inner surface of the processing tank.

20. The apparatus according to claim 14, further comprising:
an overflow tank that recovers the processing solution overflowing from the processing tank;
a circulating pipe that returns, to the processing tank, the processing solution recovered in the overflow tank; and
a circulating pump provided in the circulating pipe,
wherein the circulating pipe is connected to the processing solution nozzle.

21. The apparatus according to claim 14, further comprising a lifter that supports the plurality of substrates in a substantially vertical posture and is movable up and down between a processing position of the plurality of substrates that is in the processing tank and a standby position of the plurality of substrates that is above the processing tank.

\* \* \* \* \*